US009642256B2

(12) United States Patent
Olivieri et al.

(10) Patent No.: US 9,642,256 B2
(45) Date of Patent: May 2, 2017

(54) ELECTRONIC ASSEMBLY WITH FRAME FOR THERMAL DISSIPATION

(71) Applicant: Deere & Company, Moline, IL (US)

(72) Inventors: Pablo G. Olivieri, Downey, CA (US); Sushil Khandelwal, Pune (IN); Stephen Piltingsrud, Fargo, ND (US); Mark D. Schmaltz, Fargo, ND (US)

(73) Assignee: DEERE & COMPANY, Moline, IL (US)

( * ) Notice: Subject to any disclaimer, the term of this patent is extended or adjusted under 35 U.S.C. 154(b) by 99 days.

(21) Appl. No.: 14/503,451

(22) Filed: Oct. 1, 2014

(65) Prior Publication Data
US 2016/0037621 A1    Feb. 4, 2016

Related U.S. Application Data

(60) Provisional application No. 62/032,289, filed on Aug. 1, 2014.

(51) Int. Cl.
*H05K 1/00* (2006.01)
*H05K 7/20* (2006.01)
*H05K 1/14* (2006.01)

(52) U.S. Cl.
CPC ........ *H05K 1/144* (2013.01); *H05K 7/20445* (2013.01); *H05K 2201/042* (2013.01); *H05K 2201/10166* (2013.01); *H05K 2201/2018* (2013.01)

(58) Field of Classification Search
None
See application file for complete search history.

(56) References Cited

U.S. PATENT DOCUMENTS

| | | | |
|---|---|---|---|
| 5,910,884 A * | 6/1999 | Garza | G06F 1/20 165/80.3 |
| 6,319,756 B2 | 11/2001 | Duesman et al. | |
| 2005/0084252 A1 * | 4/2005 | Satou | G11B 17/0405 386/230 |

(Continued)

OTHER PUBLICATIONS

AgGPS 170 Field Computer, Rugged Field Computer for Field Management. Product brochure [online]. Trimble, 2003 [retrieved on Mar. 11, 2015]. Retrieved from the Internet: <URL: http://www.rustsales.cn/products/ziliaoku/ag170/Ag170%20datasheet.pdf>.

(Continued)

*Primary Examiner* — Courtney Smith
*Assistant Examiner* — Zhengfu Feng

(57) ABSTRACT

An electronic assembly comprises a first circuit board with a first substrate having an inner side and an outer side opposite the inner side. A plurality of primary components are mounted on the inner side of the first circuit board. A frame (e.g., or heat-sinking spacer) is secured to the first circuit board. A second circuit board comprises a second substrate having an inner side and an outer side opposite the first side. The second circuit board is secured to the frame and separated from the first circuit board in at least one spatial dimension. At least one secondary component is mounted on the second circuit board. A first housing section is adapted for mating with a second housing section. The first housing section and the second housing section collectively enclose the first circuit board and the second circuit board.

19 Claims, 4 Drawing Sheets

(56) References Cited

U.S. PATENT DOCUMENTS

| | | | | |
|---|---|---|---|---|
| 2006/0221576 A1* | 10/2006 | Takano | ............... | H01L 23/3672 |
| | | | | 361/719 |
| 2008/0074839 A1* | 3/2008 | Tamaki | ..................... | G06F 1/20 |
| | | | | 361/679.46 |
| 2011/0292624 A1* | 12/2011 | Tanaka | ................... | H05K 5/006 |
| | | | | 361/752 |
| 2013/0329356 A1* | 12/2013 | Shanbhogue | .......... | H05K 1/144 |
| | | | | 361/679.47 |

OTHER PUBLICATIONS

AgGPS 170 Field Computer, Rugged Field Computer for Precision Agriculture. Product brochure [online]. Trimble 2002 [retrieved on Mar. 11, 2015]. Retrieved from the Internet: <URL: http://www.rustsales.com.cn/products/ziliaoku/ag170/Ag170%20technical%20notes.pdf>.

* cited by examiner

ELECTRONIC ASSEMBLY WITH FRAME FOR THERMAL DISSIPATION

RELATED APPLICATION

This document (including the drawings) claims priority and the benefit of the filing date based on U.S. provisional application No. 62/032,289, filed Aug. 1, 2014 under 35 U.S.C. §119 (e), where the provisional application is hereby incorporated by reference herein.

FIELD OF INVENTION

This disclosure relates to an electronic assembly with a frame for thermal dissipation.

BACKGROUND

The longevity and reliability of an electronic assembly may be impacted by the ability of the electronic assembly to dissipate heat from operating components, such as switching devices, semiconductors, integrated circuits, application specific integrated circuits, digital signal processors, data processors, inductors, capacitors, or resistors. Accordingly, there is need to improve or enhance the heat dissipation of the electronic assembly.

SUMMARY

In accordance with one embodiment, an electronic assembly comprises a first circuit board with a first substrate having an inner side and an outer side opposite the inner side. One or more primary components are mounted on the inner side of the first circuit board. A frame (e.g., or heat-sinking spacer) is secured to the first circuit board. A second circuit board comprises a second substrate having an inner side and an outer side opposite the outer side. The second circuit board is secured to the frame and separated from the first circuit board in at least one spatial dimension. At least one secondary component is mounted on the second circuit board. A first housing section is adapted to mate with a second housing section. The first housing section and the second housing section collectively enclose the first circuit board and the second circuit board.

DETAILED DESCRIPTION

Figure 1:
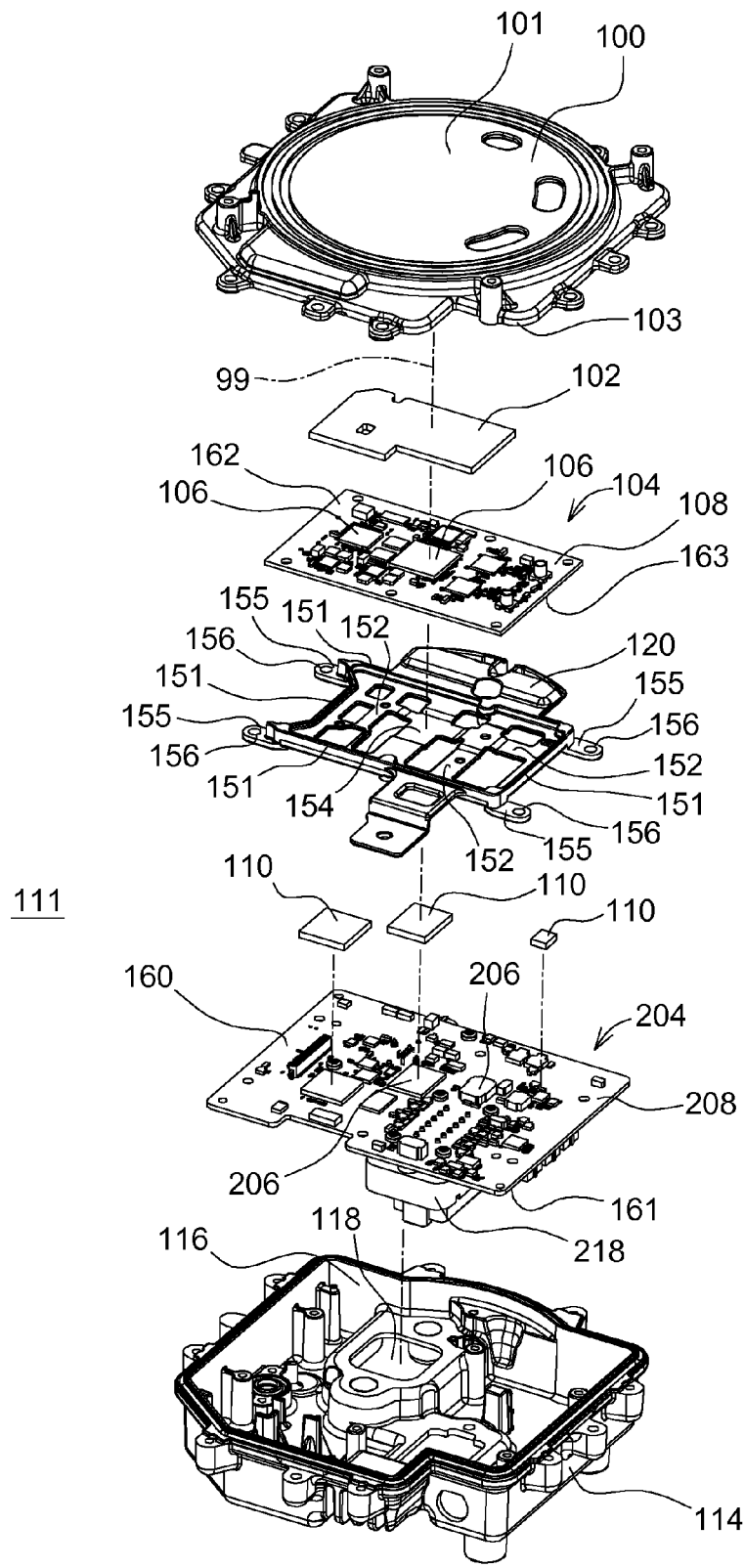
FIG. 1 is an exploded perspective view of one embodiment of the electronic assembly.

In accordance with one embodiment, FIG. 1 illustrates an exploded perspective view of the electronic assembly. The electronic assembly comprises a first circuit board 204 and a second circuit board 104. The first circuit board 204 has a first substrate 208 with an inner side 160 and an outer side 161 opposite the inner side 160. The substrate 208 may comprise a ceramic, polymeric other dielectric layer with conductive metallic traces on one or more sides (160, 161). Primary components 206 are mounted on, in or through the inner side 160 of the first circuit board 204. A frame 120 (or heat-sinking spacer) is secured to the first circuit board 204.

A second circuit board 104 comprises a second substrate 108 that has an inner side 163 and an outer side 162 opposite the inner side 163. The substrate 108 may comprise a ceramic, polymeric other dielectric layer with conductive metallic traces on one or more sides (162, 163). The second circuit board 104 is secured to the frame 120 and separated from the first circuit board 204 in at least one spatial dimension (e.g., a vertical dimension as illustrated in FIG. 1). One or more secondary components 106 are mounted on, through or in the second circuit board 104.

Figure 2:
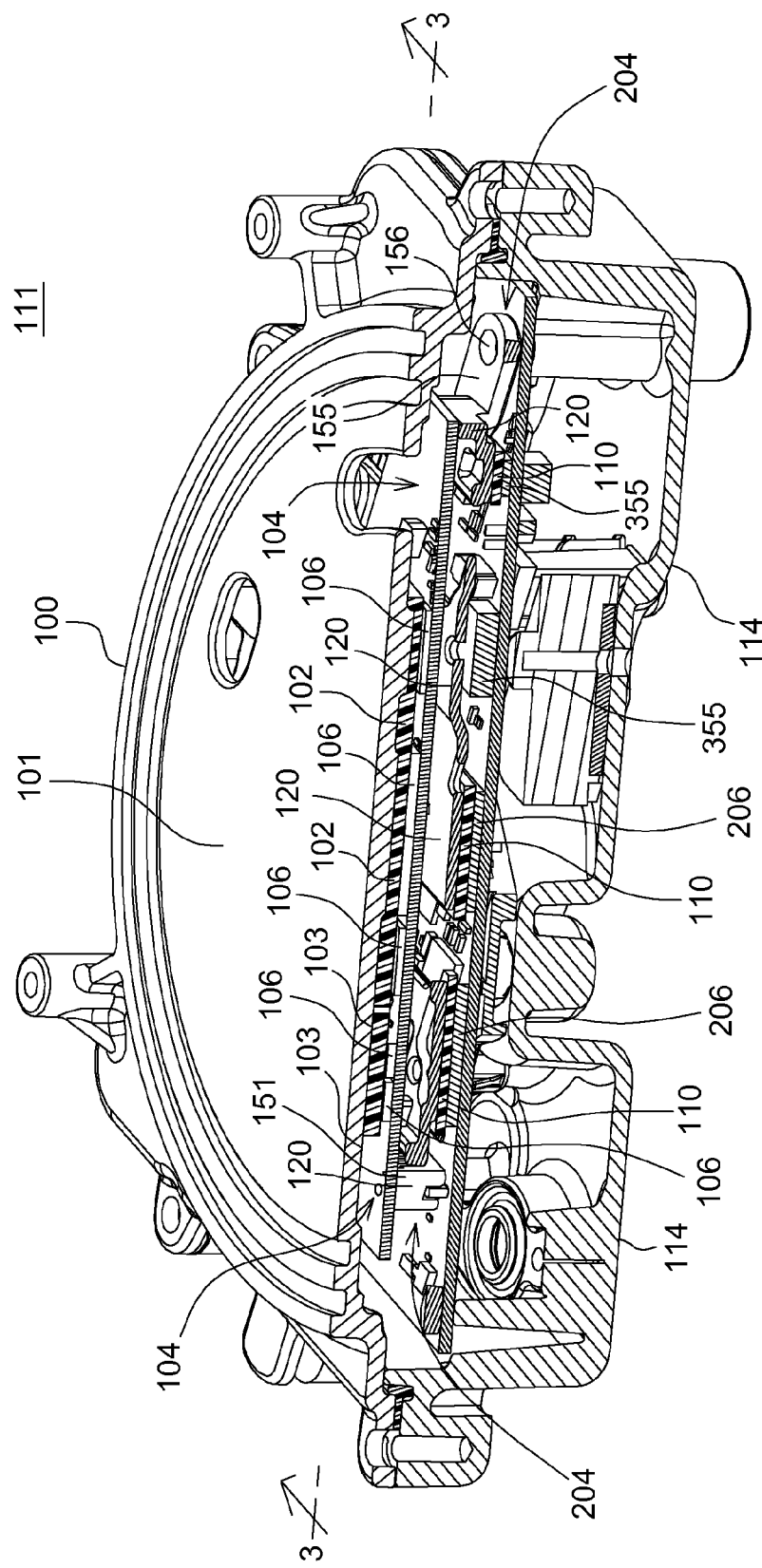
FIG. 2 is a perspective view of one embodiment of the electronic assembly of FIG. 1 that is cut away to reveal an internal cross-section.
Figure 3:
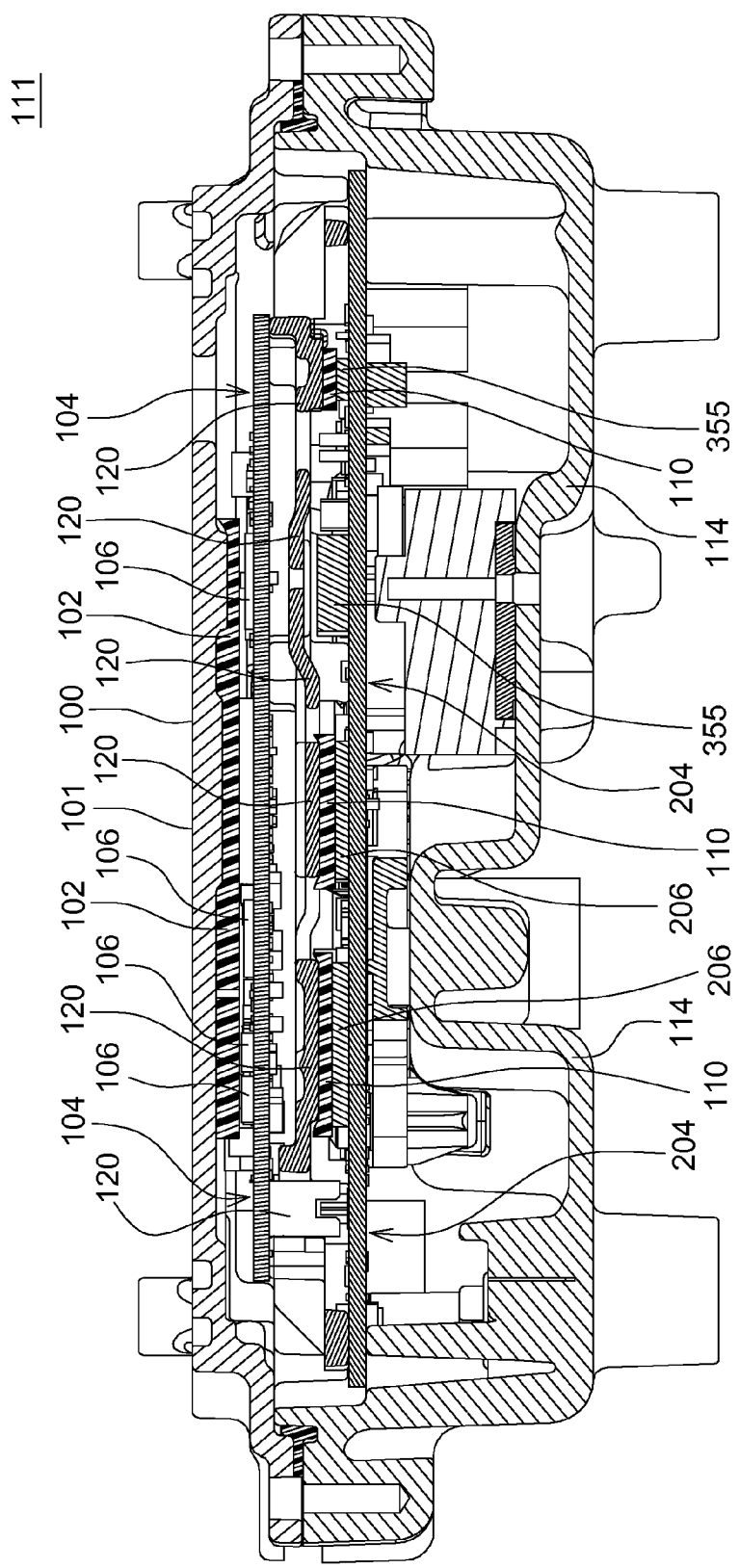
FIG. 3 is a cross-sectional view taken along reference line 3-3 of FIG. 2.

A first housing section 114 is adapted to mate with a second housing section 100. When the electronic assembly is assembled as shown in FIG. 2 and FIG. 3, the first housing section 114 and the second housing section 100, collectively, enclose the first circuit board 204, the frame 120 and the second circuit board 104.

Frame

Figure 4:
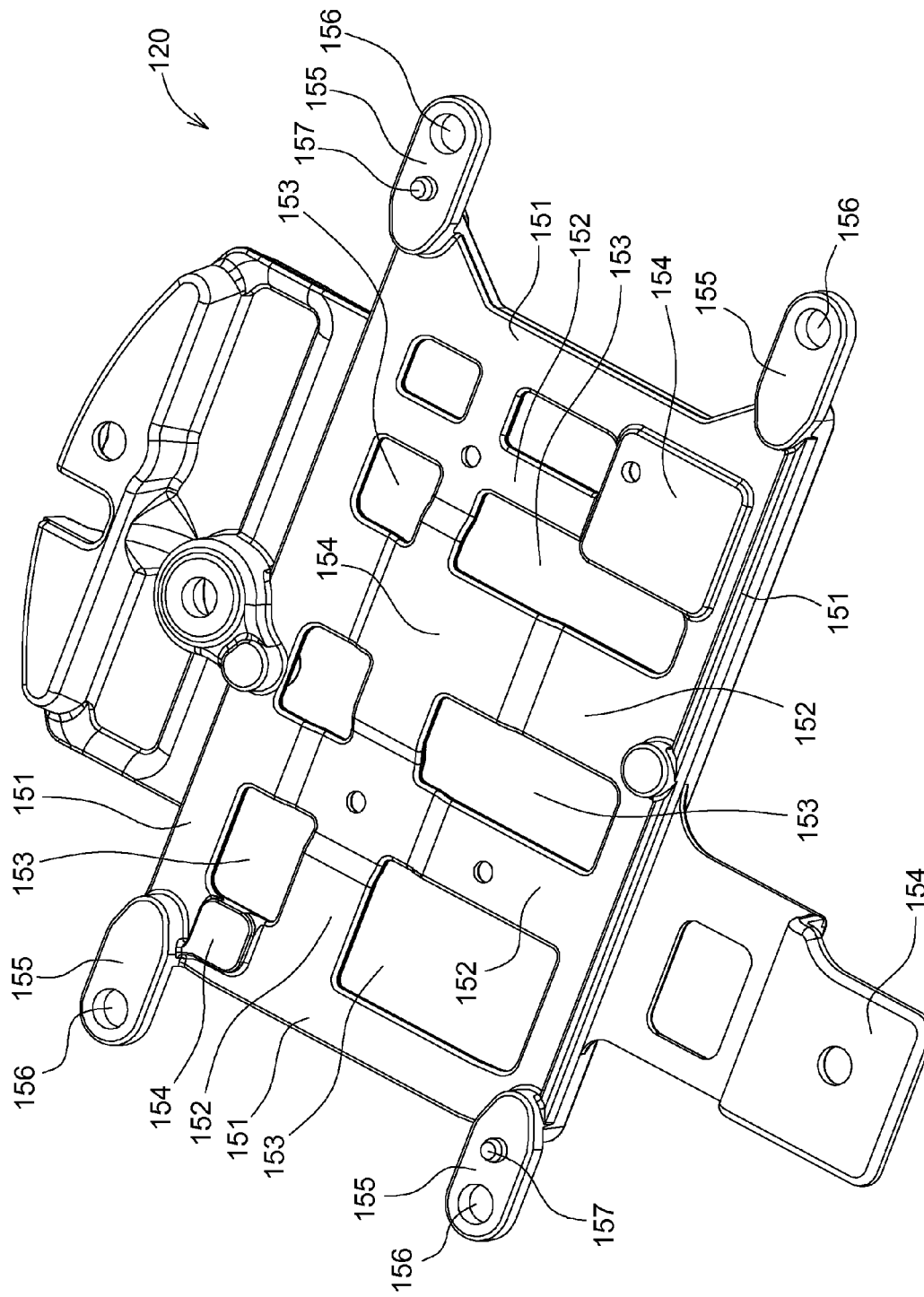
FIG. 4 is a perspective view of a frame within the electronic assembly.

In one embodiment, the frame 120 comprises a structure or heat-sinking spacer that separates spatially the first circuit board 204 from the second circuit board 104 in at least one dimension (e.g., a generally vertical dimension as shown in FIG. 1). The first frame 120 facilitates mechanical coupling of the first circuit board 204 to the second circuit board 104. As shown in FIG. 1 and FIG. 4, the frame 120 comprises a peripheral portion 151 and inner structural members 152 that are integrally formed or attached to the peripheral portion 151, where at least some of the inner structural members 152 are associated with heat-sinking interfaces or mating surfaces 154. Although the frame 120 facilitates mechanical coupling of the first circuit board 204 and the second circuit board 104, in an alternate embodiment, the frame 120 may facilitate both mechanical and electrical coupling between the first circuit board 204 and the second circuit board 104 (e.g., via one or more electrical connectors or mating surface mount connectors on the circuit boards).

In one embodiment, a frame 120 or its peripheral portion 151 has a plurality of mounting legs 155 with a first set of bores 156 in the mounting legs 155 for mounting the frame 120 to the first circuit board 204 with fasteners (e.g., screws, rivets, or snap-fit fasteners). In one configuration, the frame 120 has a second set of second bores 157 (in FIG. 4) adapted to receive fasteners associated with a second circuit board 104. Although the second set of bores 157 is located inward toward a center (central axis 99) of the circuit boards in FIG. 1, other arrangements of the bores (156, 157) are possible. Further, frame 120 has one or more openings 153 (e.g., a series of openings 153 separated by curved or generally linear structural members 152) in the structural members 152 or a central region of the frame 120 to allow for components on the first circuit board 204, the second circuit board 104 or both to provide spatial clearance between the components and the frame 120.

In one embodiment, the frame 120 can be composed of a metal, and alloy, aluminum or an aluminum alloy. For example, the frame 120 may comprise a die-cast aluminum structure, or a structure that is stamped from sheet metal.

In an alternate embodiment, the frame 120 may be composed of plastic, polymer, a carbon-fiber filled plastic, a carbon-fiber filled polymer, a composite with a filler and a polymer or plastic matric, or ceramic material.

The frame 120 can provide heat sinking for the heat-generating components (primary components 206, secondary components 106, or both) of first circuit board 204 and the second circuit board 104 by providing one or more of the following: (1) a material mass of sufficient size for heat sinking or heat dissipation, (2) a first air gap between the frame 120 and the first circuit board 204, and (3) a second air gap between the frame 120 and the second circuit board 104. In one configuration, the first air gap may have variable height or thickness that is defined by or bounded by the first circuit board 204 (and the components mounted thereon) and the frame 120. Similarly, in one configuration the second air gap may have variable height or thickness that is defined by or bounded by the second circuit board 104 (and the components mounted thereon) and the frame 120. Further, the frame 120 may support thermal paths from packages of the heat-generating components or from conductive pads 355 on the surface of the first circuit board 204, the second circuit board 104 or both.

There are several possible thermal paths where the frame 120 dissipates thermal energy. Such thermal paths may be used separately or cumulatively, or in conjunction with other heat sinking measures or other thermal pathways described in this disclosure. In accordance with a first thermal path, heat generated at a primary component 206 is present at a face (upward face in FIG. 1) of the outer package of the primary component 206 on the inner side 160 of the first circuit board 204. In the first thermal path, one or more primary components 206, directly or indirectly, transmit or communicate heat to the frame 120 via one or more corresponding heat-sinking interfaces or mating surfaces 154 of the frame 120. In certain configurations, one or more primary components 206 may directly contact one or more corresponding heat-sinking interface or mating surfaces 154 of the frame 120, or a thermally conductive adhesive or thermal grease may be used at the interface between the components and heat sinking interface. In other configurations, as illustrated in FIG. 1, primary dielectric members 110 are placed between one or more primary components 206 and one or more corresponding heat-sinking interfaces (or mating surfaces 154 of the frame 120), where the primary dielectric members 110 are thermally conductive. Accordingly, the frame 120 provides the heat sinking by its material mass, the first air gap, or the second air gap as described above.

In accordance with a second thermal path, heat generated at a primary component 206 is present at a face (e.g., an upward face in FIG. 1) of a conductive pad (e.g., planar metallic member or conductive pour) on the inner side 160 of the first circuit board 204. In the second thermal path, one or more conductive pads, directly or indirectly, transmits or communicates heat to the frame 120 via one or more corresponding heat-sinking interfaces or mating surfaces 154 of the frame 120. In certain configurations, one or more conductive pads may directly contact one or more corresponding heat-sinking interface or mating surfaces 154 of the frame 120, or a thermally conductive adhesive or thermal grease may be used at the interface between the conductive pads and heat sinking interface. In other configurations, as illustrated in FIG. 1, primary dielectric members 110 are placed between one or more conductive pads and one or more corresponding heat-sinking interface (or mating surfaces 154 of the frame 120), where the primary dielectric members 110 are thermally conductive. Accordingly, the frame 120 provides the heat sinking by its material mass, the first air gap, or the second air gap as described above.

Dielectric Members

The dielectric members may comprise primary dielectric members 110 that are positioned (e.g., sandwiched) between the frame 120 and the first circuit board 204, or secondary dielectric members 102 that are positioned (e.g., sandwiched) between the second circuit board 104 and (an interior 103 of) the second housing section 100, although other locations of the dielectric members are possible and fall within the scope of the disclosure and accompanying claims. For example, in an alternate embodiment, dielectric members may be positioned between the second circuit board 104 and frame 120, between the first circuit board 204 and the first housing section 114, or both. In one embodiment, the primary dielectric members 110 and the secondary dielectric members 102 are composed of a thermally conductive gap filler. For example, the primary dielectric members 110 and the secondary dielectric members 102 are composed of a thermally conductive gap filler with a thermal conductance that exceeds a threshold thermal conductance (E.g., 1 Watt/meter-Kelvin at a reference pressure of 25 pounds per square inch). In one embodiment, the primary dielectric members 110, the secondary dielectric members 102, or both, comprise thermally conductive gap filler pads that were commercially available from Parker Chomerics division of Parker-Hannifin Corporation under its trademark THERM-A-GAP, when this document was prepared, where Parker-Hannifin has offices at 6035 Parkland Boulevard, Cleveland, Ohio 44124.

The dielectric members support various thermal paths that facilitate heat dissipation from the heat-generating components, the first circuit board 204 and the second circuit board 104. Certain thermal paths, which may be applied separately and cumulatively with any other thermal paths disclosed in this document, support heat dissipation via the frame 120 to the first air gap, the second air gap, or both. Other thermal paths, which may be applied separately and cumulatively with any other thermal paths, support heat dissipation via the second housing section 100 to ambient air, or a heat sink associated with the second housing section 100. For example, the second housing section 100 may have a planar exterior surface 101, a finned exterior surface or an exterior surface with a pattern or field of protrusions for heat dissipation.

In one embodiment, one or more primary dielectric members 110 overlie corresponding ones of the respective primary components 206 to transfer thermal energy from the primary components 206 to the frame 120. In other embodiments, one or more primary dielectric members 110 overlie corresponding ones of the respective primary conductive pads (355 in FIG. 2) to transfer thermal energy from the primary conductive pads (355) to the frame 120. A radiating surface area of the primary dielectric member 110 corresponds to a mating surface area of proportional size and shape of the frame 120 for receiving the radiating surface area of the primary dielectric member 110. The mating surface area comprises a heat-sinking interface or receiving surface area of the frame 120. As illustrated in FIG. 1, the radiating surface area is generally rectangular, although the primary dielectric members 110 may have any geometric shape. For example, the geometric shape may correspond in size and shape to that of one or more primary components 206, one or more primary conductive pads 355, or both on the first circuit board 204. In one embodiment, the mating surface 154 comprises a flush planar surface of the frame 120, or recessed planar surface in the frame 120.

In one embodiment, a secondary dielectric member 102 overlies one or more of the secondary components 106 to transfer thermal energy from the one or more respective secondary components 106 to second housing section 100. In other embodiments, one or more secondary dielectric members 102 overlie corresponding ones of the secondary conductive pads to transfer thermal energy from the secondary conductive pads to the second housing section 100. A radiating surface area of the secondary dielectric member 102 corresponds to a receiving surface area of proportional size and shape in an interior 103 of the second housing section 100 for receiving the radiating surface area of the secondary dielectric member 102.

As shown in FIG. 1, the first circuit board 204 comprises a double-sided circuit board. Accordingly, primary components 206 are mounted both on the inner side 160 and the outer side 161 of the first circuit board 204. In one embodiment, the primary dielectric members 110 are compressed when or after the frame 120 is secured to the first circuit board 204. For example, the primary dielectric members 110 are compressed between one or more primary components 206 and the first circuit board 204 when or after the frame 120 is secured to the first circuit board 204. In one embodiment, secondary dielectric members 102 are compressed when or after the second circuit board 104 is mated or connected to the second housing section 100 (and the first housing section 114). For example, the secondary dielectric members 102 are compressed between one or more secondary components 106 and the second housing section 100 when or after the second housing section 100 is mated or connected to the first housing section 114. Similarly, the primary dielectric members 110 can be compressed between one or more primary conductive pads and the first circuit board 204 when or after the frame 120 is secured to the first circuit board 204; the secondary dielectric members 102 are compressed between one or more secondary conductive pads and the second housing section 100 when or after the second housing section 100 is mated or connected to the first housing.

In an alternate embodiment, the primary dielectric members 110, the secondary dielectric member 102, or both are not compressed. Instead, in the alternate embodiment, one or more primary dielectric members 110 contact or are adhesively bonded to the one or more primary components 206 and the first circuit board 204 when or after the frame 120 is secured to the first circuit board 204. Similarly, in an alternate embodiment, one or more secondary dielectric members 102 contact or adhesively bond to a mating interior surface of an interior 103 of the second housing section 100.

First Housing Section and Second Housing Section

In one embodiment, the first housing section 114 and the second housing section 100 can be composed of a metal, an alloy, or aluminum or aluminum alloy. In an alternative embodiment, the first housing section 114 and the second housing section 100 are composed of plastic, polymer, a carbon-fiber filled plastic, a carbon-fiber filled polymer, a composite with a filler and a polymer or plastic matric, or ceramic material. As shown, the first housing section 114 has provisions for mounting the first circuit board 204, or an assembly of the first circuit board 204, the second circuit board 104 and the frame 120 to the first housing section 114. The first housing section 114 is connected to the second housing section 100 via one or more fasteners positioned about the peripheries of the first housing section 114 and the second housing section 100.

FIG. 2 is a perspective view of one embodiment of the electronic assembly of FIG. 1 that is cut away to reveal an internal cross-section. The cross-sectional view of FIG. 2 is taken from a perspective to reveal the interface between the dielectric members (102, 110) and the other elements of the electronic assembly 111.

In accordance with one embodiment, one or more primary dielectric members 110 overlie corresponding ones of the respective primary components 206 to transfer thermal energy from the primary components 206 to the frame 120. As illustrated in FIG. 2, primary dielectric members 110 are placed between one or more primary components 206 and one or more corresponding heat-sinking interfaces (or mating surfaces 154 of the frame 120), where the primary dielectric members 110 are thermally conductive. A radiating surface area of the primary dielectric member corresponds to a receiving surface area (heat-sinking surface area or mating surface area) of proportional size and shape of the frame 120 for receiving the radiating surface area of the primary dielectric member. Accordingly, the frame 120 provides the heat sinking by its material mass, the first air gap, or the second air gap as described above.

In an alternate configurations, as illustrated in FIG. 2, primary dielectric members 110 are placed between one or more conductive pads (instead a surface of the package of a component) and one or more corresponding heat-sinking interface (or mating surfaces 154 of the frame 120), where the primary dielectric members 110 are thermally conductive. Accordingly, the frame 120 provides the heat sinking by its material mass, the first air gap, or the second air gap as described above.

In FIG. 2 in accordance with one embodiment, a secondary dielectric member 102 overlies one or more of the secondary components 106 to transfer thermal energy from the one or more respective secondary components 106 to second housing section 100. In other embodiments, one or more secondary dielectric members 102 overlie corresponding ones of the secondary conductive pads to transfer thermal energy from the secondary conductive pads to the second housing section 100. A radiating surface area of the secondary dielectric member corresponds to a receiving surface area of proportional size and shape in an interior 103 of the second housing section 100 for receiving the radiating surface area of the secondary dielectric member 102.

FIG. 3 is a cross-sectional view taken along reference line 3-3 of FIG. 2. Like reference numbers in FIG. 1, FIG. 3 and FIG. 2 indicate like elements.

In FIG. 3, an assembly of the first circuit board 204, the second circuit board 104 and the frame 120 to the first housing section 114. The first housing section 114 is connected to the second housing section 100 via one or more fasteners positioned about the peripheries of the first housing section 114 and the second housing section 100. As illustrated in FIG. 1, the first circuit board 204 is associated with a connector 218 that extends outward from the outer side 161 and through a respective opening 118 in the first housing 114.

FIG. 4 is a perspective view of a frame 120 within the electronic assembly. Like reference numbers in FIG. 1 and FIG. 4 indicate like elements. The frame 120 of FIG. 4 is described above.

In accordance with the electronic assembly of this disclosure, the frame 120 separates the two circuit boards and removes heat by conducting heat away from the components that produce heat in localized areas. Between the frame 120 and the one or more components (e.g., electronic components) dielectric members (e.g., thermally conductive pads) fill uneven spatial volumes and conduct the heat away from the component to the frame 120 or the housing. There are multiple attachment points between the frame 120 and the housing where the heat is removed to the outside surrounding ambient air.

Having described the preferred embodiment, it will become apparent that various modifications can be made without departing from the scope of the invention as defined in the accompanying claims.

The following is claimed:

1. An electronic assembly comprising:
a first circuit board comprising a first substrate having an inner side and an outer side opposite the inner side;
a plurality of primary components mounted on the inner side of the first circuit board;
a heat-sinking frame secured to the first circuit board, the frame having one or more openings in a central region of the frame, the frame having a plurality of mounting legs with first bores in the mounting legs for mounting the frame to the first circuit board with fasteners;
a primary dielectric member directly overlying or on an upward face of a package of a corresponding one of the primary components, where the primary dielectric member is between the frame and a corresponding one of the primary components to transfer heat from the upward face of the package of the primary component to the frame;
a second circuit board comprising a second substrate having an inner side and an outer side opposite the first side, the second circuit board secured to the frame and separated from the first circuit board in at least one spatial dimension;
a secondary component mounted on the second circuit board;
a first housing section; and
a second housing section for mating with the first housing section and collectively enclosing the first circuit board and the second circuit board.

2. The electronic assembly of claim 1 further comprising:
a plurality of primary dielectric members for overlying corresponding ones of the primary components to transfer thermal energy from the primary components to the frame.

3. The electronic assembly according to claim 1 wherein a radiating surface area of the primary dielectric member corresponds to a receiving surface area of proportional size and shape of the frame for receiving the radiating surface area of the primary dielectric member.

4. The electronic assembly according to claim 1 wherein a radiating surface area is generally rectangular and wherein a receiving surface comprises a flush planar surface of the frame, or recessed planar surface in the frame.

5. The electronic assembly of claim 1 further comprising:
a secondary dielectric member for overlying one or more of the secondary components to transfer thermal energy from the one or more secondary components to the second housing section.

6. The electronic assembly according to claim 5 wherein a radiating surface area of the secondary dielectric member corresponds to a receiving surface area of proportional size and shape in an interior of the second housing section for receiving the radiating surface area of the secondary dielectric member.

7. The electronic assembly according to claim 1 wherein the frame has a set of second bores is adapted to receive fasteners associated with the second circuit board.

8. The electronic assembly according to claim 1 wherein the frame has the one or more openings in the central region of the frame to allow for components on the first circuit board, the second circuit board or both to have spatial clearance between the components and the frame.

9. The electronic assembly according to claim 2 wherein the primary dielectric members are composed of a thermally conductive gap filler.

10. The electronic assembly according to claim 1 wherein the primary dielectric members and the secondary dielectric member are composed of a thermally conductive gap filler with a thermal conductance that exceeds a threshold thermal conductance.

11. The electronic assembly of claim 1 wherein the frame, the first housing section and the second housing section are composed of a metal, an alloy, or aluminum.

12. The electronic assembly of claim 1 wherein the primary components are mounted both on the inner side and the outer side of the first circuit board.

13. The electronic assembly of claim 1 wherein the primary dielectric members are compressed when or after the frame is secured to the first circuit board.

14. The electronic assembly of claim 1 wherein the secondary dielectric members are compressed when or after the second housing is mated or connected to the first housing.

15. The electronic assembly according to claim 5 wherein the secondary dielectric members are composed of a thermally conductive gap filler.

16. The electronic assembly according to claim 1 wherein the one or more openings are separated by curved or generally linear structural members.

17. The electronic assembly according to claim 1 wherein the heat-sinking frame comprises a heat-sinking spacer that is adapted to provide a first air gap between the frame and the first circuit board and a second air gap between the frame and the second circuit board.

18. The electronic assembly according to claim 1 wherein the primary dielectric member comprises a thermally conductive pad.

19. The electronic assembly according to claim 1 wherein a radiating surface of the primary dielectric member is generally rectangular.

* * * * *